United States Patent
Schulze et al.

(10) Patent No.: US 9,012,980 B1
(45) Date of Patent: Apr. 21, 2015

(54) METHOD OF MANUFACTURING A SEMICONDUCTOR DEVICE INCLUDING PROTON IRRADIATION AND SEMICONDUCTOR DEVICE INCLUDING CHARGE COMPENSATION STRUCTURE

(71) Applicant: Infineon Technologies AG, Neubiberg (DE)

(72) Inventors: Hans-Joachim Schulze, Taufkirchen (DE); Hans Weber, Bayerisch Gmain (DE); Werner Schustereder, Villach (AT); Wolfgang Jantscher, Villach (AT); Helmut Strack, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/096,804

(22) Filed: Dec. 4, 2013

(51) Int. Cl.
*H01L 29/66* (2006.01)
*H01L 29/06* (2006.01)
*H01L 21/66* (2006.01)
*H01L 21/265* (2006.01)
*H01L 29/78* (2006.01)

(52) U.S. Cl.
CPC ........... *H01L 29/0634* (2013.01); *H01L 22/26* (2013.01); *H01L 21/265* (2013.01); *H01L 29/7802* (2013.01)

(58) Field of Classification Search
None
See application file for complete search history.

(56) References Cited

U.S. PATENT DOCUMENTS

| 6,566,201 B1 | 5/2003 | Blanchard |
| 8,367,532 B2 | 2/2013 | Mauder et al. |
| 8,421,196 B2 | 4/2013 | Weber et al. |
| 2003/0011039 A1* | 1/2003 | Ahlers et al. .................. 257/493 |

FOREIGN PATENT DOCUMENTS

WO  2007085387 A1  8/2007

* cited by examiner

*Primary Examiner* — Kyoung Lee
(74) *Attorney, Agent, or Firm* — Murphy, Bilak & Homiller, PLLC

(57) ABSTRACT

A method of manufacturing a semiconductor device includes forming a charge compensation device structure in a semiconductor substrate. The method further includes measuring a value of an electric characteristic related to the charge compensation device. At least one of proton irradiation and annealing parameters are adjusted based on the measured value. Based on the at least one of the adjusted proton irradiation and annealing parameters the semiconductor substrate is irradiated with protons, and thereafter, the semiconductor substrate is annealed.

20 Claims, 5 Drawing Sheets

METHOD OF MANUFACTURING A SEMICONDUCTOR DEVICE INCLUDING PROTON IRRADIATION AND SEMICONDUCTOR DEVICE INCLUDING CHARGE COMPENSATION STRUCTURE

BACKGROUND

Semiconductor devices known as charge compensation or super junction (SJ) semiconductor devices, e.g. SJ insulated gate field effect transistors (SJ IGFETs) are based on mutual space charge compensation of n- and p-doped regions in a semiconductor substrate allowing for an improved trade-off between low area-specific on-state resistance Ron×A and high breakdown voltage Vbr between load terminals such as source and drain. Performance of charge compensation or SJ semiconductor devices depends upon a lateral or horizontal charge balance between the n-doped and p-doped regions. Process tolerances lead to deviations of a target charge balance that may result in an undesirable decrease of device performance such as a reduction in a source to drain breakdown voltage.

It is desirable to improve the trade-off between the area-specific on-state resistance and the blocking voltage of a semiconductor device and to reduce the impact of process tolerances on this trade-off.

SUMMARY

An embodiment refers to a method of manufacturing a semiconductor device. A charge compensation device structure is formed in a semiconductor substrate. A value of an electric characteristic related to the charge compensation device is measured. At least one of proton irradiation and annealing parameters are adjusted based on the measured value. Based on the at least one of the adjusted proton irradiation and annealing parameters the semiconductor substrate is irradiated with protons, and thereafter, the semiconductor substrate is annealed.

According to an embodiment of a semiconductor device, the semiconductor device comprises a charge compensation structure including p-doped and n-doped regions arranged consecutively in a semiconductor substrate along a lateral direction. The semiconductor device further includes a first dopant species dominating a doping profile of the p-doped regions and a second dopant species dominating a doping profile of the n-doped regions. The semiconductor device further includes hydrogen-related donors in the p-doped and n-doped regions. The hydrogen-related donors differ from the second dopant species.

According to another embodiment of a semiconductor device, the semiconductor device comprises a charge compensation structure including p-doped and n-doped regions arranged consecutively in a semiconductor substrate along a lateral direction. The semiconductor device further includes an n-doped field stop zone between the charge compensation structure and a second side of the semiconductor substrate. Within a range of the n-doped field stop zone, an end-of-range peak profile of hydrogen-related donors is smaller than a profile of another n-type dopant species of the n-doped field stop zone.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

DETAILED DESCRIPTION

Figure 1A:
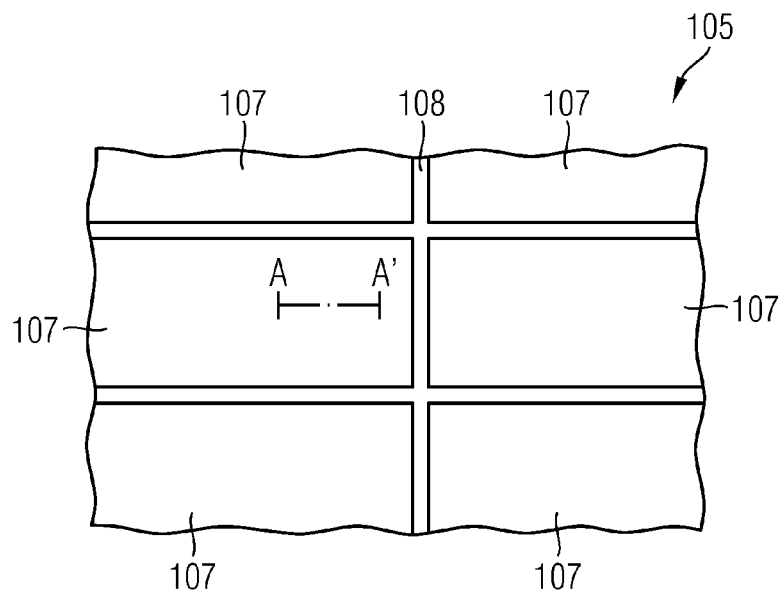
FIGS. 1A to 1E are schematic views illustrating one embodiment of a semiconductor device with respect to different process features.

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A to 1E refer to an embodiment of manufacturing a semiconductor device.

The method comprises forming a charge compensation device structure in a semiconductor substrate. In the schematic top view of FIG. 1A, a portion of a semiconductor substrate 105 is illustrated. The semiconductor substrate 105 may be a semiconductor wafer including a plurality of semiconductor dies 107. Each one of the semiconductor dies 107 includes the charge compensation device structure. An area between the semiconductor dies 107 may be used for wafer dicing accomplished by scribing and breaking, by mechanical sawing or by laser cutting, for example. Test structures for monitoring process stability may be arranged in the area 108. The test structures may include pn junctions between several or any combination of p-doped regions and n-doped regions. In additional or as an alternative, the test structures may also include resistors for monitoring sheet resistance of the p-doped regions and the n-doped regions. When arranging the test structures in the area 108, measurement of the test structures may be carried out before dicing the wafer 105 into singularized dies 107.

Figure 1B:
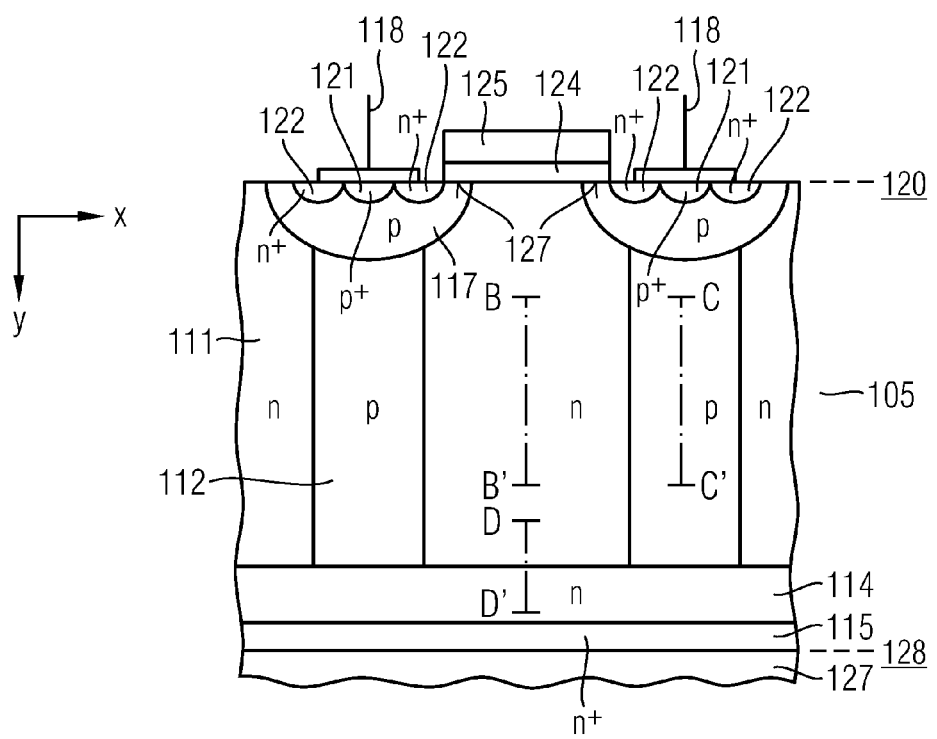

FIG. 1B illustrates one embodiment of a cross-sectional view along line A-A' of the semiconductor die 107 illustrated in FIG. 1A. The semiconductor die 107 includes a charge compensation device structure including alternating n-doped and p-doped regions 111, 112 alternating along a lateral direction x. According to an embodiment, the n-doped regions 111 and the p-doped regions 112 extend in parallel as stripes along a lateral direction perpendicular to the drawing plane of FIG. 1B. According to another embodiment, the p-doped regions 112 constitute separate p-doped pillars or islands surrounded by the n-doped region 111 being a continuous n-doped region with respect to a top view of FIG. 1B. According to another embodiment, the n-doped regions 111 are separate n-doped pillars or islands surrounded by the p-doped region 112 being a continuous p-doped region with respect to a top view of FIG. 1B. A top view of the p-doped islands or n-doped islands may be square-shaped, rectangular, circular or polygonal, for example. In the embodiment illustrated in FIG. 1B, the semiconductor die 107 includes a vertical super-junction (SJ) n-channel field-effect transistor (NFET). The vertical SJ NFET includes an optional n-doped field stop zone 114 between the charge compensation device structure and an n+-doped drain region 115. Each one of the p-doped regions 112 adjoins a bottom side of a p-doped body region 117. The p-doped body region 117 is electrically coupled to a source contact 118 at a first side 120 of the semiconductor substrate 105 via an optional p+-doped body contact region 121. N+-doped source regions 122 adjoin the first side 120 and are electrically coupled to the source contact 118. A gate structure including a gate dielectric 124 and a gate electrode 125 is arranged on the semiconductor substrate 105 at the first side 120 and is configured to control a conductivity in a channel region 127 by field effect. Thereby, a current flow between the source contact 118 at the first side 120 and a drain contact 127 at a second side 128 can be controlled. The source and drain contacts 118, 127 may include conductive materials such as metal(s) and/or highly doped semiconductor material (s). In the embodiment illustrated in FIG. 1B, the source and drain contacts 118, 127 are present before the subsequent method features described with respect to FIGS. 1C to 1E below. According to another embodiment, at least one of the source and drain contacts, e.g. the source contact 118 or the drain contact 127 or both contacts 118, 127 will be formed after the method features described with respect to FIGS. 1C to 1E below.

The vertical SJ NFET illustrated in FIG. 1B is one example of a semiconductor device including the charge compensation device structure. Other embodiments may include vertical SJ p-channel FETs, lateral SJ FETs including source and drain contacts at a common side, lateral or vertical insulated gate bipolar transistors (IGBTs), for example.

Figure 1C:
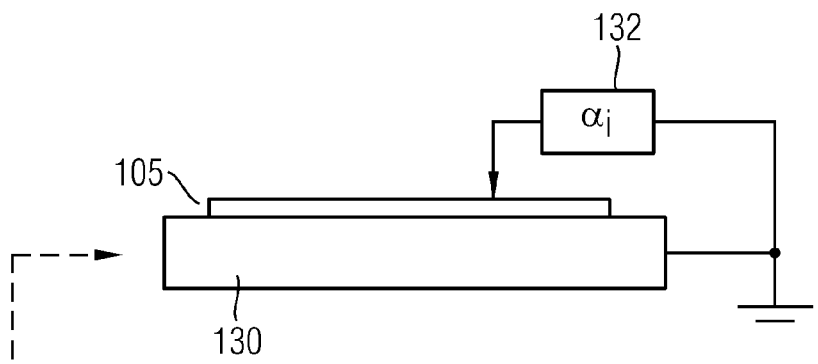

Referring to the schematic view illustrated in FIG. 1C, the method further comprises measuring a value of an electric characteristic $\alpha_i$ related to the charge compensation device structure. In the embodiment illustrated in FIG. 1C, the semiconductor substrate 105 is arranged on a carrier 130 and the electric characteristic $\alpha_i$ is measured via a measurement equipment 132. The measurement equipment 132 may include a wafer prober. As an example, the semiconductor substrate may be vacuum-mounted on a wafer chuck and electrically connected via probes brought into electrical contact with the semiconductor substrate 105. When the electric characteristic $\alpha_i$ of a die has been measured, the wafer prober moves the semiconductor substrate 105 to the next die and measurement of the electric characteristic of the next die can start. According to an embodiment, the electric characteristic $\alpha_i$ corresponds to a breakdown voltage Vbd between a source and a drain of a SJ FET or between a collector and an emitter of an IGBT, for example. The breakdown voltage Vbd may be measured between respective electrodes of the SJ semiconductor device or with respect to a test structure arranged within an area of a semiconductor die 107 and/or within the area 108 illustrated in FIG. 1A. According to an embodiment, a metal electrode provides electric contact to the test structure but any metal structures are missing in an area of the charge compensation device structure. According to yet another embodiment, the probes are brought into contact with highly doped semiconductor regions of the semiconductor substrate without any intervening metal structures. According to yet another embodiment, metal electrodes and/or a contact support layer, e.g. a highly doped polysilicon layer are arranged on the semiconductor substrate for reducing a contact resistance between the probes and the semiconductor substrate and may be removed before proton irradiation described with respect to FIG. 1D.

The electric characteristic $\alpha_i$ characterizes a charge balance of the charge compensation device structure with respect to a target value. Since the charge balance constitutes a reference parameter for correction of an overall charge in the n- and p-doped regions 111, 112, precision of correction can be improved with respect to a correction process having the overall charge in the n- and p-doped regions 111, 112 as the reference parameter for correction.

Based on the measured value of the electric characteristic $\alpha_i$ related to the charge compensation device structure, proton irradiation and/or annealing parameters are adjusted. According to an embodiment, at least one of number, dose and energy of proton irradiation are adjusted based on the measured value of the electric characteristic $\alpha_i$. According to an embodiment, the adjusted proton irradiation parameters include an implantation dose in a range of $2 \times 10^{14}$ cm$^{-2}$ and $8 \times 10^{14}$ cm$^{-2}$ and an implantation energy in a range of 1.0 MeV and 3.0 MeV. According to an embodiment, the adjusted proton irradiation parameters are configured to shift a charge balance of the charge compensation device structure based on the measured value of the electric characteristic towards or to a target charge balance of the charge compensation device structure. Irradiation of the semiconductor substrate with the adjusted proton irradiation parameters will generate hydrogen-related donors leading to an increase of n-doping in both the p- and n-doped regions 111, 112 of the charge compensation device structure.

Figure 1D:
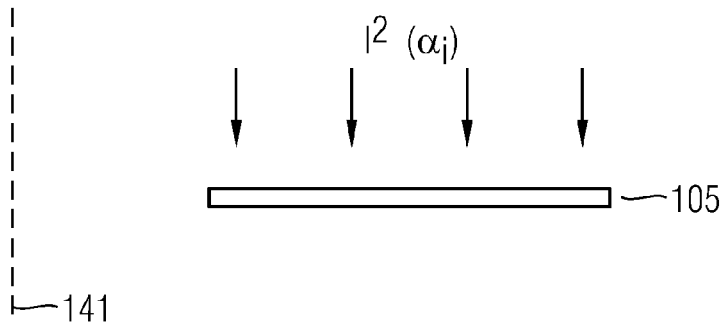

Referring to the schematic view of FIG. 1D, the method further comprises irradiating the semiconductor substrate 105 with protons based on the adjusted proton irradiation parameters (c.f. $I^2(\alpha_i)$ in FIG. 1D). According to an embodiment, the semiconductor substrate 105 is radiated from the first side, e.g. a front side of the semiconductor substrate 105. At the first side 120 control electrode(s) such as gate electrode(s) may be arranged and electrically coupled to a wiring area. According to another embodiment, the semiconductor substrate 105 is irradiated with protons from the second side 128 opposite to the first side 120. At the second side 128, a drain electrode of a SJ FET or a collector electrode of an IGBT may be arranged. According to yet another embodiment, the semiconductor substrate 105 is irradiated with protons from the first and second sides 120, 128.

Figure 1E:
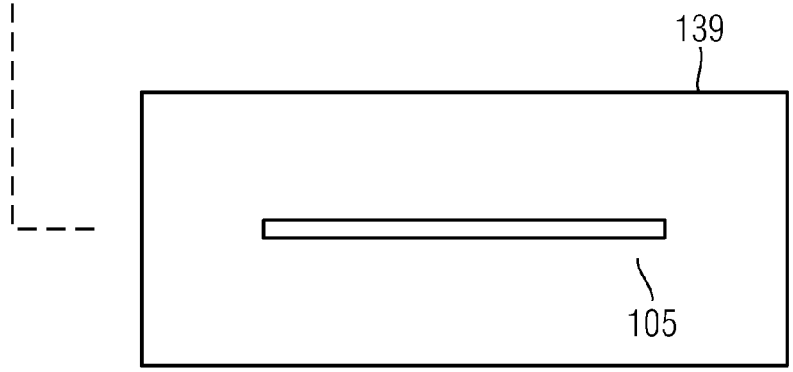

Referring to the schematic view of FIG. 1E, the method further comprises annealing the semiconductor substrate 105. According to an embodiment, annealing is carried out under inert atmosphere or air in an annealing equipment such as a chamber or an oven. Annealing temperatures typically range between 350° C. and 550° C., or between 380° C. and 500° C. Duration of the annealing typically ranges between 30 minutes and 10 hours, e.g. between 1 and 5 hours. A resulting donor concentration and vertical distribution can also be adjusted by annealing temperature and annealing duration.

The doping is effected predominantly in the so-called end-of-range region of the proton implantation, and to a lesser extent in the region radiated through. Annealing of the substrate 105 leads to diffusion of the hydrogen into the irradiated area and may also reach the surface radiated through whereby the formation of complexes comprising the hydrogen atoms and the irradiation-induced defects like e.g. vacancies results in the creation of donors, e.g. so-called hydrogen-related donors in this region.

Since at least one of the proton irradiation and annealing parameters are based on the measured value of the electric characteristic $\alpha_i$ related to the charge compensation device, a precise correction process of charge balance in the n-doped and p-doped regions 111, 112 of the charge compensation device structure can be carried out with respect to an overall depth of a voltage absorbing volume of the charge compensation device structure, e.g. with respect to an overall depth of a drift zone of the charge compensation device. According to an embodiment, the hydrogen-related donors extend over at least 30% of a vertical extension of a drift zone between a first side and a second side of the semiconductor substrate. According to another embodiment, a concentration of the hydrogen-related donors is in a range of $5 \times 10^{13}$ cm$^{-3}$ and $8 \times 10^{14}$ cm$^{-3}$.

As is indicated by a dashed line 141 between FIGS. 1E and 1C, the above-described correction process may be repeated. According to an embodiment, the electric characteristic $\alpha_i$ is measured again as described with respect to FIG. 1C and, depending upon whether the measured electric characteristic $\alpha_i$ is out of a range of tolerance, proton irradiation and annealing as illustrated in FIGS. 1D and 1E may be carried out to increase the number of n-charges in the charge balance of the charge compensation device structure. In case the measured value of the electric characteristic $\alpha_i$ reveals an excess of n-type charges with respect to a target charge balance in the charge compensation device structure, proton irradiation as illustrated in FIG. 1D may be dispensed with and the number of n-type charges in the charge compensation device structure may be lowered by an additional process of annealing the semiconductor substrate 105 as is illustrated in FIG. 1E. Thus, depending upon whether n-type charges or p-type charges dominate the charge balance of the charge compensation device structure, the correction process towards a target charge balance may either dispense with additional proton implantation and decrease the number of n-type charges in the charge compensation device structure by an additional annealing process of the semiconductor substrate (c.f. FIG. 1E) or, in a case of excess p-type charges in charge compensation device structure, the number of n-type charges may be increased by additional proton implantation and annealing as illustrated in FIG. 1D, 1E and as described above. Furthermore, according to an embodiment, annealing the semiconductor substrate may be carried out with a thermal budget configured to deactivate at least a part of donors generated by proton irradiation and annealing. Thereby, a concentration of hydrogen-related donors generated by proton irradiation and annealing may also be decreased.

Figure 2:
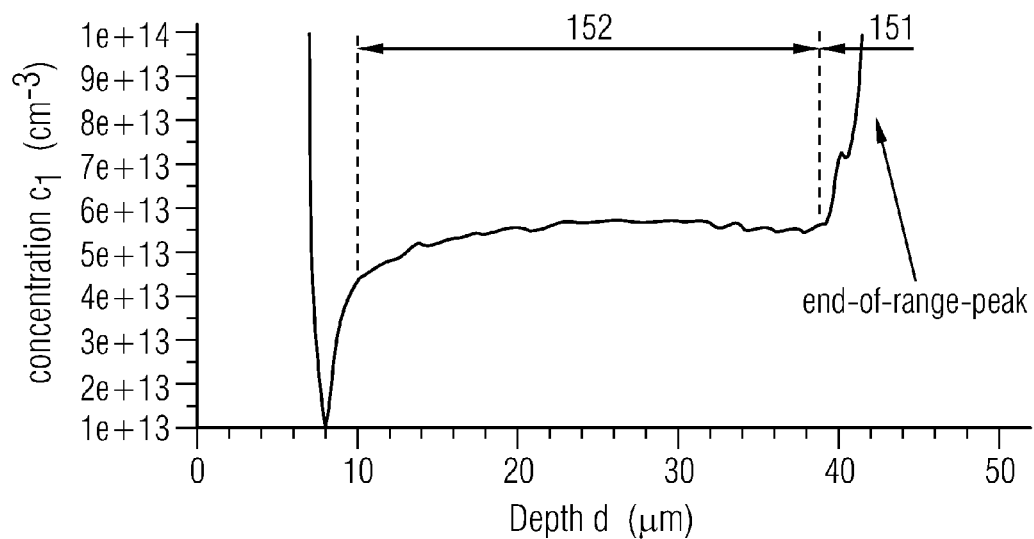
FIG. 2 is a schematic diagram illustrating one example of a profile of hydrogen-related donors generated by irradiating the semiconductor substrate illustrated in FIG. 1A with protons followed by an annealing process.

FIG. 2 illustrates a measured profile of concentration $c_1$ of hydrogen-related donors versus a depth d of a semiconductor substrate. Proton irradiation occurred from a first side, e.g. along a direction of increasing values of depth d which may correspond to the direction y illustrated in FIG. 1B, for example. Diffusion of the hydrogen and the formation of donors due to creation of hydrogen/vacancy-complexes in an end of range area 151 by thermal processing leads to an almost homogeneous doping with hydrogen-related donors in an area 152. By appropriately adjusting parameters such as proton irradiation dose, proton irradiation energy, annealing temperature and annealing duration, the end-of-range area 151 may be adjusted to fall within a field stop zone of a charge compensation device and the area 152 of almost homogeneous doping with hydrogen-related donors may be adjusted to fall within a voltage absorbing region, e.g. a drift zone of a charge compensation device structure of a charge compensation device.

Figure 3:
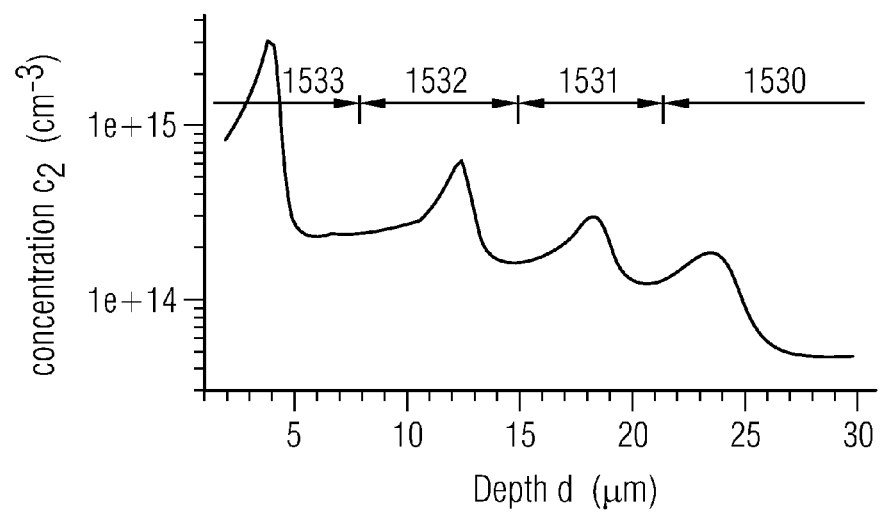
FIG. 3 is a schematic diagram illustrating another example of a profile of hydrogen-related donors generated by irradiating the semiconductor substrate illustrated in FIG. 1A multiple times with protons followed by an annealing process.

FIG. 3 illustrates a measured profile of concentration $c_2$ of hydrogen-related donors versus a depth d of a semiconductor substrate. Multiple proton irradiations occurred from the first side, e.g. along a direction of increasing values of depth d which may correspond to the direction y illustrated in FIG. 1B, for example. Diffusion of the hydrogen and the formation of donors due to the creation of hydrogen/vacancy-complexes in and between the end of range areas by thermal processing leads to overlapping profiles of hydrogen-related donors, whereas each one of peak areas 1530, 1531, 1532, 1533 is associated with a separate proton implantation process. The sequence of proton implantations illustrated in FIG. 3 with respect to the peak areas is e.g. 1530, 1531, 1532, 1533. A broadening of the profile 1530 is larger than in the peak areas 1531, 1532, 1533. Likewise, a broadening of the profile in the peak area 1531 is larger than in the peak areas 1532, 1533 and a broadening of the profile in the peak area 1532 is larger than in the peak areas 1533 due to larger irradiation energies resulting in an increased width of the end-of-range peak.

By appropriately adjusting parameters such as proton irradiation dose, proton irradiation energy, annealing temperature and annealing duration, the peak areas 1530, 1531, 1532,

1533 may be adjusted with respect to peak height, broadening, depth of peak, overlap with neighboring peak areas, for example.

According to other embodiments, proton irradiation may be carried out from opposite sides such as the first and second sides 120, 128 illustrated in FIG. 1B.

Figure 4A:
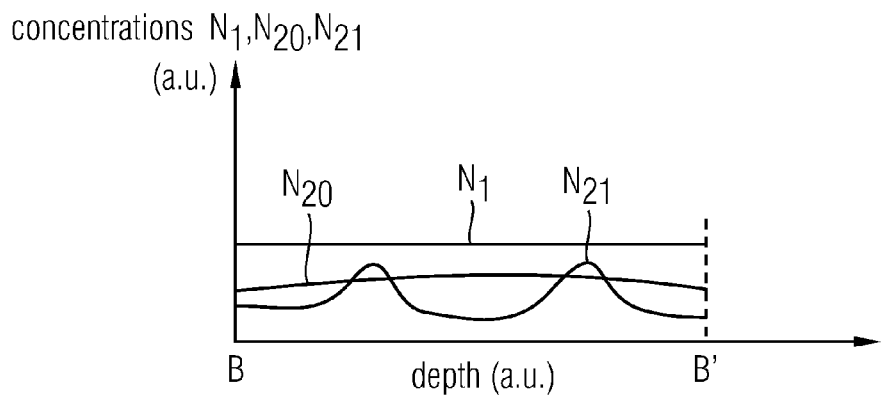
FIG. 4A is a schematic diagram illustrating embodiments of n-type dopant profiles including hydrogen-related donors along line B-B' of the semiconductor substrate illustrated in FIG. 1B.

FIG. 4A is a schematic diagram illustrating embodiments of n-type dopant profiles along line B-B' of the semiconductor substrate 105 illustrated in FIG. 1B.

The illustrated dopant profile relates to the n-type region 111. The n-type region 111 includes a first concentration $N_1$ of n-type dopants. The dopant concentration $N_1$ may be formed by in-situ doping while manufacturing the charge compensation device structure, e.g. in-situ doping during epitaxial growth or deposition. In addition or as an alternative, the concentration $N_1$ may be formed by ion implantation of n-type dopants, e.g. when manufacturing the charge compensation device structure by a so-called multiple epitaxy technology, for example. According to an embodiment, a dopant species of the dopant concentration $N_1$ may include one or more of phosphor (P), antimony (Sb) and arsenic (As). A profile of the first concentration $N_1$ of the n-type dopants may be almost constant or include an undulation which may be caused by multiple ion implantation processes of n-type dopants in the multiple epitaxy technology.

In addition to the first concentration $N_1$ of the n-type dopants the n-type region 111 further includes, according to an embodiment, a second concentration $N_{20}$ of hydrogen-related donors which is almost homogeneous and formed by a single proton implantation as illustrated, for example, in FIG. 2.

The second concentration $N_{20}$ may be formed in conjunction with correcting a charge balance in the charge compensation device structure as illustrated in FIGS. 1C to 1D, i.e. after measuring the electric characteristic $\alpha_i$ related to the charge compensation device structure, adjusting proton irradiation and annealing parameters based on the measured value, irradiating the semiconductor substrate with protons and annealing the semiconductor substrate based on the adjusted proton irradiation and annealing parameters.

According to another embodiment, a second concentration $N_{21}$ of hydrogen-related donors may include multiple peaks due to overlapping profiles of hydrogen-related donors caused by multiple proton irradiations at different energies as illustrated in FIG. 3, for example.

Similar to second concentration $N_{20}$ illustrated in FIG. 4A, the second concentration $N_{21}$ may also be formed in conjunction with correcting a charge balance in the charge compensation device structure as illustrated in FIGS. 1C to 1D, i.e. after measuring the electric characteristic $\alpha_i$ related to the charge compensation device structure, adjusting proton irradiation and annealing parameters based on the measured value, irradiating the semiconductor substrate with protons and annealing the semiconductor substrate based on the adjusted proton irradiation and annealing parameters.

Figure 4B:
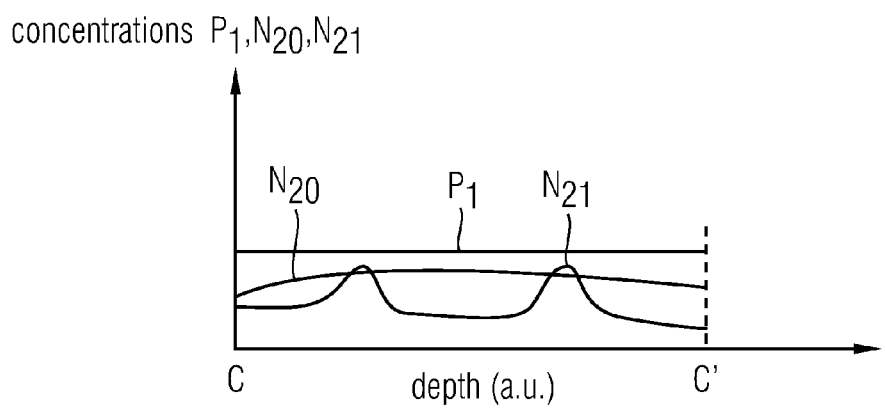
FIG. 4B is a schematic diagram illustrating embodiments of n-type and p-type dopant profiles including hydrogen-related donors along line C-C' of the semiconductor substrate illustrated in FIG. 1B.

FIG. 4B is a schematic diagram illustrating embodiments of p-type and n-type dopant profiles along line C-C' of the semiconductor substrate 105 illustrated in FIG. 1B. A net doping along the line C-C' is p-type and relates to the p-type region 112. The p-type region 112 includes a first concentration $P_1$ of p-type dopants. The dopant concentration $P_1$ may be due to in-situ doping while manufacturing the charge compensation device structure, e.g. in-situ doping during epitaxial growth or deposition. In addition or as an alternative, the concentration $P_1$ may be due to ion implantation of p-type dopants, e.g. when manufacturing the charge compensation device structure by a so-called multiple epitaxy technology.

According to an embodiment, a dopant species of the dopant concentration $P_1$ may include one or more of boron (B), indium (In), aluminum (Al), gallium (Ga). A profile of the first concentration $P_1$ of p-type dopants may be almost constant or include an undulation which may be caused by multiple ion implantation processes of p-type dopants in the multiple epitaxy technology. In addition to the first concentration $P_1$ of p-type dopants the p-type region 112 further includes, according to an embodiment, a counter-doping by the second concentration $N_{20}$ of hydrogen-related donors which is almost homogeneous and caused by a single proton implantation as illustrated, for example, in FIG. 2. The hydrogen-related donors constituting the second concentration $N_{20}$ may be simultaneously formed in the n-type and p-type regions 111, 112 for the same purpose of charge balance correction, for example.

According to another embodiment, the p-type region 112 further includes the second concentration $N_{21}$ of hydrogen-related donors having multiple peaks caused by overlapping profiles of hydrogen-related donors resulting from multiple proton irradiations at different energies as illustrated in FIG. 3, for example.

Figure 4C:
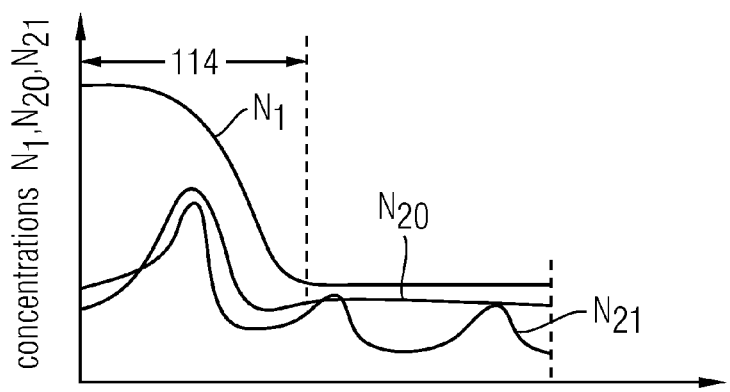
FIG. 4C is a schematic diagram illustrating embodiments of n-type dopant profiles including hydrogen-related donors along line D-D' of the semiconductor substrate illustrated in FIG. 1B.

FIG. 4C is a schematic diagram illustrating embodiments of n-type dopant profiles along line D-D' of the semiconductor substrate 105 illustrated in FIG. 1B. The profile along line D-D' is an extension of the profile along the line C-C' into the optional field stop zone 114.

According to an embodiment, end-of-range peaks of the first concentrations $N_{20}$, $N_{21}$ of hydrogen-related donors are located within the optional field stop zone 114.

The method of charge balance correction illustrated in FIGS. 1A to 1E relates to a vertical charge compensation device including load terminals, e.g. source and drain at opposite first and second sides 120, 128 of the semiconductor substrate 105.

Figure 5:
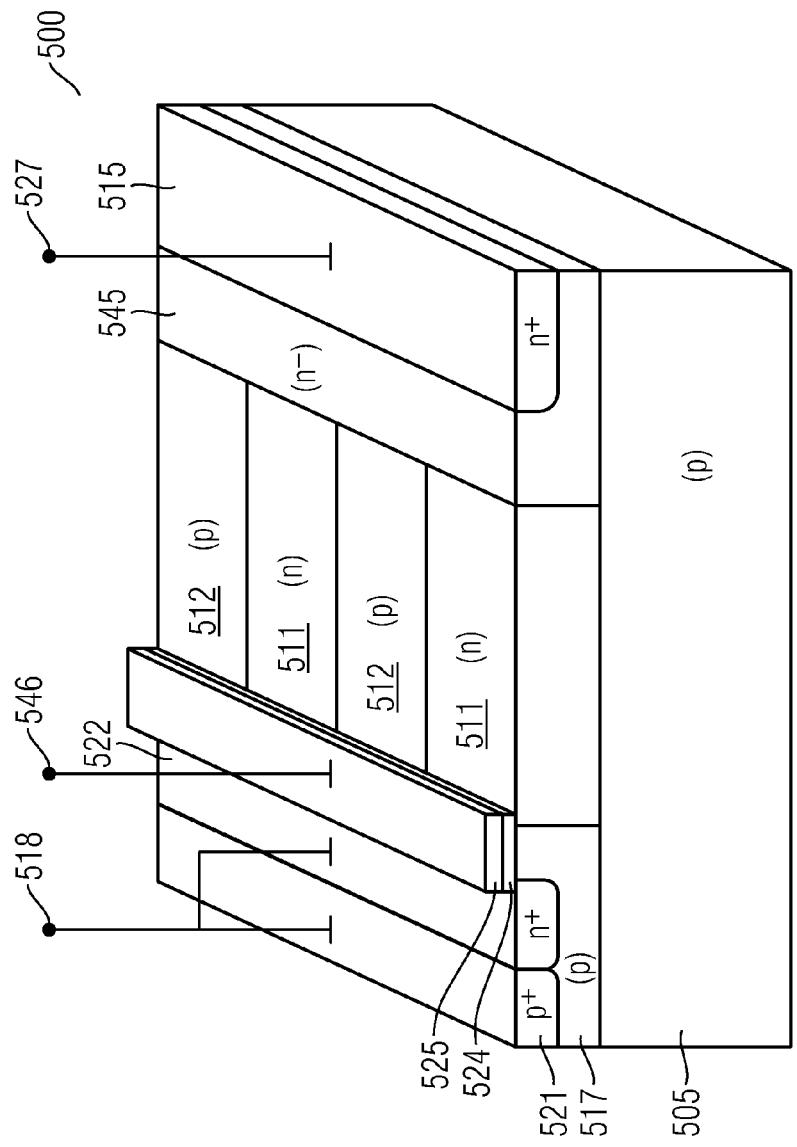
FIG. 5 is a schematic cross-sectional view one embodiment of a lateral semiconductor device with a charge compensation structure including hydrogen-related donors in both of alternating p- and n-type regions of the charge compensation structure.

The method may also be applied to other device layouts. One example of another device layout is a lateral charge compensation or SJ FET 500 illustrate in FIG. 5. The lateral charge compensation FET 500 includes a charge compensation device structure including n-type and p-type regions 511, 512. The n-type and p-type regions 511, 512 constitute a blocking voltage absorbing drift zone arranged between an $n^+$-type source region 522 and an $n^+$-type drain region 515. The $n^+$-type source region 522 is arranged in a p-well 517. A source electrode 518 is electrically coupled to the p-well 517 via an optional $p^+$-type contact region 521 and to the $n^+$-type source region 522. A drain electrode 527 is electrically coupled to the $n^+$-type source region 515. The n-type regions 511 are electrically coupled to the $n^+$-type drain region 515 via an optional $n^-$-type drain extension region 545.

A planar gate structure including a gate dielectric 524 and a gate electrode 525 is arranged on the p-well 517 between the $n^+$-type source region 522 and the n-type and p-type regions 511, 512. A gate electrode contact 546 is electrically coupled to the gate electrode 525. In the illustrated embodiment of FIG. 5, the charge compensation FET 500 is arranged on a p-type substrate 505. Charge balance correction in the n-type and p-type regions 511, 512 may be carried out as illustrated in FIGS. 1C to 1D and described above.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
   forming a charge compensation device structure in a semiconductor substrate;
   measuring a value of an electric characteristic related to the charge compensation device;
   adjusting at least one of proton irradiation and annealing parameters based on the measured value;
   irradiating the semiconductor substrate with protons and thereafter;
   annealing the semiconductor substrate based on the at least one of the adjusted proton irradiation and annealing parameters.

2. The method of claim 1, wherein measuring the value of the electric characteristic related to the charge compensation device includes measuring an electric breakdown voltage.

3. The method of claim 2, wherein the electric breakdown voltage is measured with respect to a test structure in the semiconductor substrate.

4. The method of claim 2, wherein the electric breakdown voltage is based on measuring electric breakdown voltages with respect to a plurality of test structures across the semiconductor substrate.

5. The method of claim 1, wherein the annealing the semiconductor substrate is carried out in a temperature range of 350° C. and 550° C. for a duration between 30 minutes and 10 hours.

6. The method of claim 1, wherein the irradiating the semiconductor substrate with protons based on the at least one of the adjusted proton irradiation and annealing parameters is carried out from a first side of the semiconductor substrate where a control terminal of the charge compensation device structure is located.

7. The method of claim 1, wherein the irradiating the semiconductor substrate with protons based on the at least one of the adjusted irradiation and annealing parameters is carried out once.

8. The method of claim 7, wherein the irradiating the semiconductor substrate with protons based on the adjusted irradiation parameters includes an implantation dose in a range of $2 \times 10^{14}$ cm$^{-2}$ and $8 \times 10^{14}$ cm$^{-2}$, an implantation energy in a range of 1.0 MeV and 3.0 MeV and annealing temperatures in a range of 380° C. and 500° C.

9. The method of claim 7, wherein the irradiating the semiconductor substrate with protons based on the at least one of the adjusted irradiation and annealing parameters places an end-of-range peak within a field stop zone.

10. The method of claim 1, wherein the irradiating the semiconductor substrate with protons based on the at least one of the adjusted irradiation and annealing parameters is carried out multiple times at different implantation energies and/or implantation doses.

11. The method of claim 10, wherein the irradiating the semiconductor substrate with protons based on the at least one of the adjusted irradiation and annealing parameters includes implantation doses in a range of $5 \times 10^{13}$ cm$^{-2}$ and $2 \times 10^{14}$ cm$^{-2}$, and annealing temperatures in a range of 380° C. and 430° C.

12. The method of claim 10, wherein the irradiating the semiconductor substrate with protons based on the adjusted at least one of the adjusted irradiation and annealing parameters is carried out between two and six times.

13. The method of claim 1, further comprising, after proton irradiation of the semiconductor substrate,
   forming a metallization at a first side of the semiconductor substrate where a control terminal of the charge compensation device structure is located; and thereafter
   annealing the semiconductor substrate in a temperature range of 350° C. and 550° C.

14. The method of claim 1, further comprising:
   forming a metallization at a first side of the semiconductor substrate where a control terminal of the charge compensation device structure is located; thereafter
   irradiating the semiconductor substrate with protons; and thereafter
   annealing the semiconductor substrate in a temperature range of 350° C. and 550° C.

15. The method of claim 1, further comprising annealing the semiconductor substrate with a thermal budget configured to deactivate at least a part of donors generated by proton irradiation and annealing.

16. A semiconductor device, comprising:
   a charge compensation structure including p-doped and n-doped regions arranged consecutively in a semiconductor substrate along a lateral direction;
   a first dopant species dominating a doping profile of the p-doped regions;
   a second dopant species dominating a doping profile of the n-doped regions; and
   hydrogen-related donors in the p-doped and n-doped regions, wherein the hydrogen-related donors differ from the second dopant species.

17. The semiconductor device of claim 16, further comprising:
   an n-doped field stop zone between the charge compensation structure and a second side of the semiconductor substrate, and
   wherein, within a range of the n-doped field stop zone,
   an end-of-range peak profile of hydrogen-related donors is smaller than a profile of another n-type dopant species of the n-doped field stop zone.

18. The semiconductor device of claim 16, wherein the hydrogen-related donors extend over at least 30% of a vertical extension of a drift zone between a first side and a second side of the semiconductor substrate.

19. The semiconductor device of claim 16, wherein a concentration of the hydrogen-related donors is in a range of $5 \times 10^{13}$ cm$^{-3}$ and $8 \times 10^{14}$ cm$^{-3}$.

20. A semiconductor device, comprising:
   a charge compensation structure including p-doped and n-doped regions arranged consecutively in a semiconductor substrate along a lateral direction; and
   an n-doped field stop zone between the charge compensation structure and a second side of the semiconductor substrate,
   wherein, within a range of the n-doped field stop zone,
   an end-of-range peak profile of hydrogen-related donors is smaller than a profile of another n-type dopant species of the n-doped field stop zone.

* * * * *